United States Patent
Wang et al.

(10) Patent No.: US 8,925,912 B2
(45) Date of Patent: Jan. 6, 2015

(54) STOPPING DEVICE, TRANSFERRING DEVICE, AND TRANSFERRING METHOD

(71) Applicant: Shenzhen China Star Optoelectronics Technology Co., Ltd., Shenzhen, Guangdong (CN)

(72) Inventors: Xingang Wang, Guangdong (CN); Xialong Fu, Guangdong (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 44 days.

(21) Appl. No.: 13/813,942

(22) PCT Filed: Dec. 28, 2012

(86) PCT No.: PCT/CN2012/087793
§ 371 (c)(1),
(2) Date: Feb. 1, 2013

(87) PCT Pub. No.: WO2014/094335
PCT Pub. Date: Jun. 26, 2014

(65) Prior Publication Data
US 2014/0174040 A1    Jun. 26, 2014

(30) Foreign Application Priority Data
Dec. 21, 2012 (CN) .......................... 201210563436.2

(51) Int. Cl.
*B65H 3/08* (2006.01)
*B65B 57/14* (2006.01)
*B65G 49/06* (2006.01)
*B65H 3/56* (2006.01)

(52) U.S. Cl.
CPC .............. *B65B 57/14* (2013.01); *B65H 3/0816* (2013.01); *B65G 49/069* (2013.01); *B65H 3/08* (2013.01); *B65H 3/56* (2013.01)
USPC .......................... 271/106; 271/104; 271/107

(58) Field of Classification Search
CPC ................................ B65H 3/0816; B65H 3/56
USPC .......................................... 271/104, 107, 106
See application file for complete search history.

(56) References Cited

U.S. PATENT DOCUMENTS 3,627,308 A * 12/1971 Stoever .......................... 271/104

FOREIGN PATENT DOCUMENTS

| CN | 1583536 A | 2/2005 |
|---|---|---|
| CN | 101503152 A | 8/2009 |

(Continued)

OTHER PUBLICATIONS

International Search Report of PCT Application No. PCT/CN2012/087793.

*Primary Examiner* — Luis A Gonzalez (57) ABSTRACT

The present disclosure provides a stopping device, which includes a first stopping plate and a second stopping plate connected to one end of the first stopping plate and cooperating with the first stopping plate to form an angle which is less than or equal to 90 degrees. The present disclosure further provides a transferring device with the stopping device and a transferring method. With the first stopping plate stopping the bonded spacing pieces, the bonding force between the spacing pieces is broken; with the stop from the second stopping plate, the bonding degree between the spacing pieces is further broken, which separates extra spacing pieces from the suction arm and further avoids fracture of the liquid crystal panel caused by the situation that a number of spacing pieces enter the package of the liquid crystal panel at the same time.

13 Claims, 6 Drawing Sheets

(56) References Cited

FOREIGN PATENT DOCUMENTS

| CN | 202245407 U | 5/2012 |
| CN | 102730440 A | 10/2012 |
| JP | 01275341 A * | 11/1989 |
| JP | 11005644 A * | 1/1999 |
| JP | 2003-206041 A | 7/2003 |
| JP | 2004002015 A * | 1/2004 |
| JP | 2010-126362 A | 6/2010 |

* cited by examiner

STOPPING DEVICE, TRANSFERRING DEVICE, AND TRANSFERRING METHOD

BACKGROUND

1. Technical Field

The present disclosure relates to technologies of liquid crystal panels, and particularly, to a stopping device, a transferring device, and a transferring method applied to the packing process of a liquid crystal panel.

2. Description of Related Art

Liquid Crystal Display (LCD) is a Flat Panel Display (FPD) that uses the characteristics of liquid crystal to display image. Compared to other types of display, LCD is thin and it requires lower driving voltage and lower power consumption, which makes it the mainstream product in the consumer goods market. The liquid crystal panel is the main component of the liquid crystal display.

After the liquid crystal panel is manufactured, the liquid crystal panel is placed into a packing box and is supplied to downstream liquid crystal display vendors. During the process of placing the liquid crystal panel into the packing box, in order to reduce the influence between the liquid crystal panels, a spacing piece is placed between two adjacent liquid crystal panels. As the coming of the liquid crystal panel of high generations, the size and the weight of each spacing piece increases in a geometric ratio. However, in the feeding area of the spacing piece, due to the stacking of the spacing pieces and the accumulation of static electricity, two or more spacing pieces are bonded together and are sucked together during the process of sucking the spacing piece. After the two or more successive spacing pieces are placed into the packing box, edges of the spacing pieces are curved, causing the edge of the liquid crystal panel which is adjacent to the spacing pieces to be curved. In the process of stacking, transferring and transporting the liquid crystal panel, due to the weight of the liquid crystal panel and due to outer forces, the liquid crystal panel may be cracked.

SUMMARY

The present disclosure provides a stopping device which can avoid fracture of a liquid crystal panel caused by a number of successive spacing pieces during the packing process of the liquid crystal panel.

The stopping device provided in the present disclosure includes a first stopping plate, and a second stopping plate connected to one end of the first stopping plate and cooperating with the first stopping plate to form an angle which is less than or equal to 90 degrees.

Preferably, a third stopping plate extends from one end of the second stopping plate which is not connected to the first stopping plate, the third stopping plate is parallel to the first stopping plate, and the first stopping plate and the third stopping plate are arranged at the same side of the second stopping plate.

Preferably, a first chamfering portion is formed on one end of the first stopping plate which is not connected to the second stopping plate, and a second chamfering portion is formed on one end of the third stopping plate which is not connected to the second stopping plate.

Preferably, a second chamfering portion is formed on one end of the third stopping plate which is not connected to the second stopping plate.

Preferably, a first chamfering portion is formed on one end of the first stopping plate which is not connected to the second stopping plate.

Preferably, a through mounting hole is formed in the first stopping plate.

Preferably, the first stopping plate is 28 mm long, and the second stopping plate is 15 mm long.

The present disclosure further provides a transferring device. The transferring device includes a suction arm, a controlling device, and a stopping device; one end of the suction arm is connected to the controlling device, and the other end thereof is provided with a suction portion; the controlling device is used for controlling the suction arm to move to a predetermined location after being stopped by the stopping device; the stopping device includes a first stopping plate and a second stopping plate connected to one end of the first stopping plate, and the first stopping plate and the second stopping plate form an angle which is less than or equal to 90 degrees.

Preferably, a third stopping plate extends from one end of the second stopping plate which is not connected to the first stopping plate, the third stopping plate is parallel to the first stopping plate, and the first stopping plate and the third stopping plate are arranged at the same side of the second stopping plate.

Preferably, a first chamfering portion is formed on one end of the first stopping plate which is not connected to the second stopping plate, and a second chamfering portion is formed on one end of the third stopping plate which is not connected to the second stopping plate.

Preferably, a second chamfering portion is formed on one end of the third stopping plate which is not connected to the second stopping plate.

Preferably, the controlling device is used for controlling the suction arm to move up and down when the suction arm passes through the first stopping plate and the third stopping plate.

Preferably, a first chamfering portion is formed on one end of the first stopping plate which is not connected to the second stopping plate.

Preferably, a through mounting hole is formed in the first stopping plate.

Preferably, the transferring device further includes a sensor, and a gap is defined between the sensor and the stopping device.

Preferably, the gap is 6 mm wide.

The present disclosure further provides a transferring method for transferring a spacing piece, including:

controlling a suction arm to suck the spacing piece and to move forward;

controlling the suction arm to move up and down for a first predetermined time interval when the spacing piece is stopped by a first stopping plate of a stopping device;

controlling the suction arm to move forward to be stopped by a second stopping plate of the stopping device; and controlling the suction arm to be separated from the spacing piece when the suction arm reaches a predetermined location.

Preferably, the transferring method further includes the following step after the step of controlling the suction arm to move forward to be stopped by a second stopping plate of the stopping device:

controlling the suction arm to move forward and controlling the suction arm to move up and down for a second predetermined time interval when the suction arm passes through a third stopping plate of the stopping device.

Preferably, the transferring method further includes the following step after the step of controlling the suction arm to move forward to be stopped by a second stopping plate of the stopping device:

detecting whether the spacing piece passes through the stopping device or not, if yes, performing the step of controlling the suction arm to be separated from the spacing piece when the suction arm reaches a predetermined location, otherwise returning to the step of detecting whether the spacing piece passes through the stopping device or not.

With the first stooping plate stopping the bonded spacing pieces, the bonding force between the spacing pieces is broken; with the stop from the second stopping plate, the bonding degree between the spacing pieces is further broken, which separates extra spacing pieces from the suction arm and further avoids fracture of the liquid crystal panel caused by the situation that a number of spacing pieces enter the packing box of the liquid crystal panel at the same time.

DESCRIPTION OF THE DRAWINGS

Many aspects of the embodiments can be better understood with reference to the following drawings. The components in the drawings are not necessarily dawns to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment is this disclosure are not necessarily to the same embodiment, and such references mean at least one.

Figure 1:
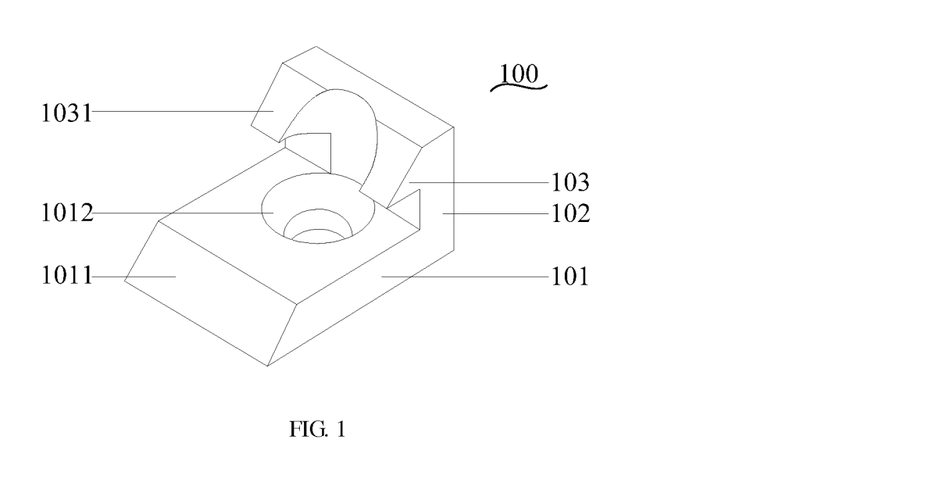
FIG. 1 is a schematic view of a stopping device in accordance with a first embodiment of the present disclosure.
Figure 2:
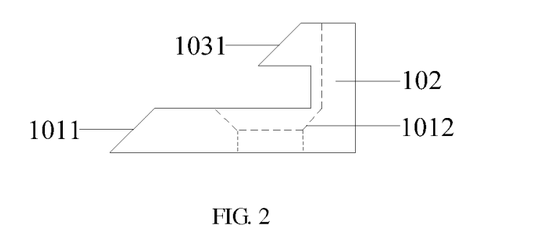
FIG. 2 is a side view of the stopping device of FIG. 1.

Referring to FIGS. 1 and 2, in which FIG. 1 is a schematic view of a stopping device in accordance with an embodiment of the present disclosure, and FIG. 2 is a side view of the stopping device of FIG. 1. The stopping device 100 includes a first stopping plate 101 and a second stopping plate 102 connected to one end of the first stopping plate 101 and cooperating with the first stopping plate 101 to form an angle.

The angle formed between the first stopping plate 101 and the stopping plate 102 ranges from 0 degree to 90 degrees. In the embodiment, the angle formed between the first stopping plate 101 and the stopping plate 102 is preferably 90 degrees. Additionally, the first stopping plate 101 is longer than the second stopping plate 102. In the embodiment, the first stopping plate 101 is 28 mm long, and the second stopping plate 102 is 15 mm long.

A third stopping plate 103 parallel to the first stopping plate 101 extends from one end of the second stopping plate 102 which is not connected to the first stopping plate 101. The extending direction in which the first stopping plate 101 extends from the second stopping plate 102 is the same as the extending direction in which the third stopping plate 103 extends from the second stopping plate 102, that is, the first stopping plate 101 and the third stopping plate 103 are arranged at the same side of the second stopping plate 102. The first stopping plate 101, the second stopping plate 102, and the third stopping plate 103 cooperate with each other to form a stopping slot.

Figure 3:
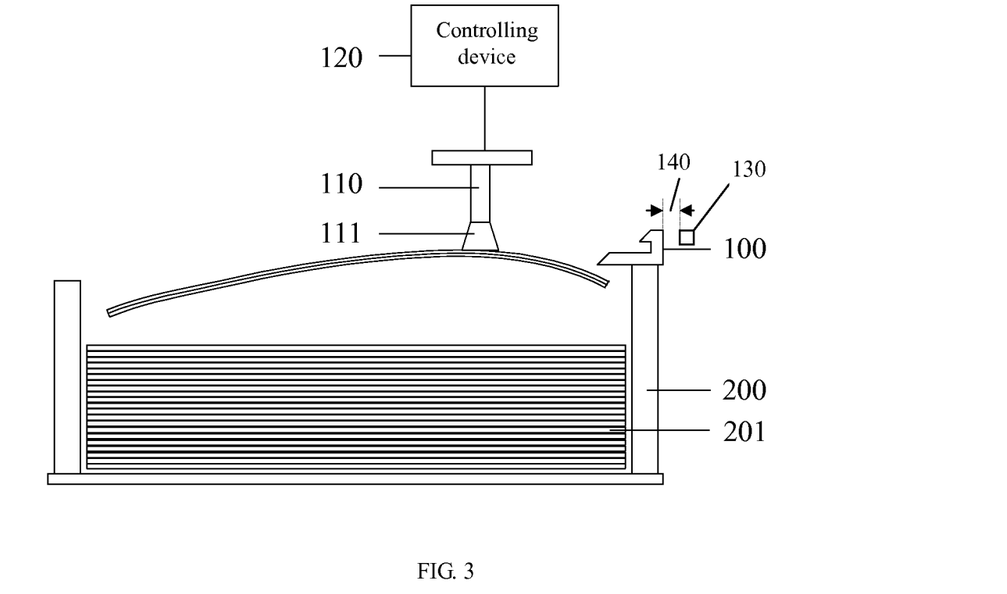
FIG. 3 is a schematic view showing that a transferring device of the present disclosure sucks spacing pieces.

Referring to FIG. 3, which is a schematic view showing that a transferring device sucks spacing pieces. The transferring device is used for catching a spacing piece 201 out from a packing box 200 and placing the spacing piece 201 on a liquid crystal panel (not shown) to space two adjacent liquid crystal panels. The transferring device includes a suction arm 110, a controlling device 120 for controlling the suction arm 110 to move, and the stopping device 100 mentioned above. One end of the suction arm 110 is connected to the controlling device 120, and the other end thereof is provided with a suction portion 111 for sucking the spacing piece 201. Under the control of the controlling device 120, the suction arm 110 sucks the spacing piece 201 and drives the spacing piece 201 to move up and down to break the bonding degree between the two bonded spacing pieces 201. In this way, the spacing piece sucked by the suction arm 110 and the other spacing piece bonded thereto under the force therebetween are separated from each other, allowing the transferring device to transfer one spacing piece 201 to a predetermined location.

The stopping device 100 can be fixed to the material-packing box 200 via a locking device (not shown). Or, the first stopping plate 101 may define a through mounting hole 1012 through which a screw (not shown) passes to fix the stopping device 100 to the packing box 200.

The transferring device can further include a sensor 130. A gap 140 is defined between the sensor 130 and the stopping device 100. The gap 140 is preferably 6 mm wide. The sensor 130 is used for detecting whether the spacing piece 201 sucked by the suction arm 110 passes through the stopping device 100 or not.

Figure 4:
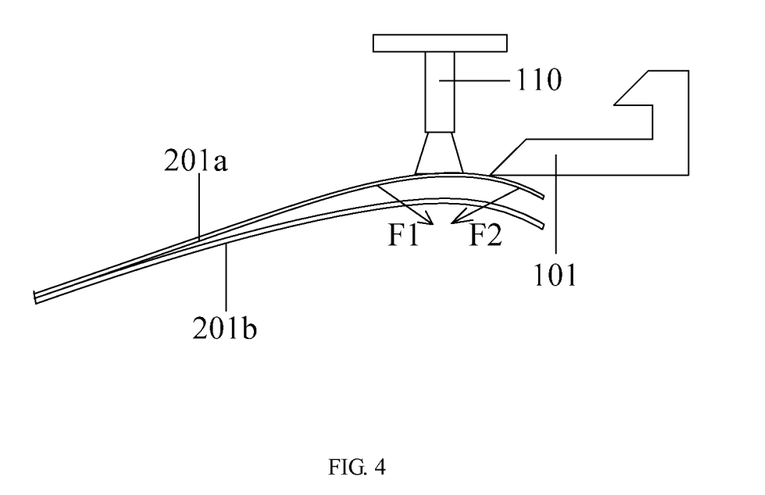
FIG. 4 is a schematic view showing the stop from a first stopping plate when the transferring device drives the spacing pieces to move up to pass through the stopping device.
Figure 5:
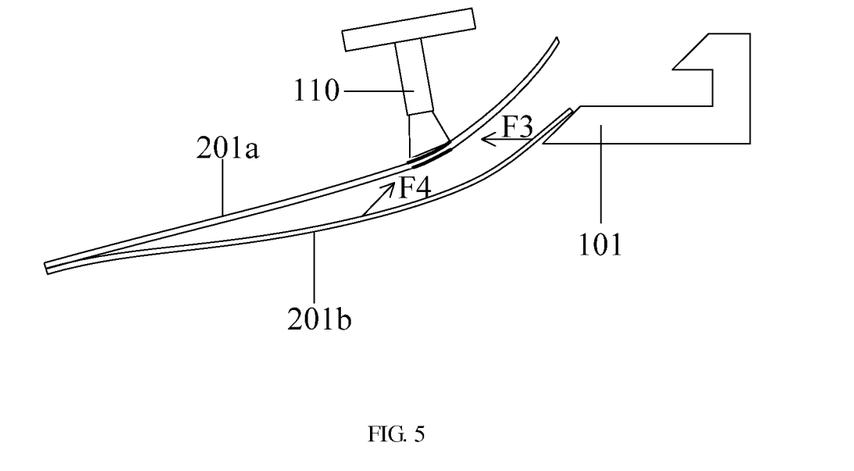
FIG. 5 is a schematic view showing the stop from the stopping plate when the transferring device drives the spacing pieces to move down to pass through the stopping device.

Referring to FIGS. 4 and 5, in which FIG. 4 is a schematic view showing the stop from the first stopping plate when the transferring device drives the spacing piece to move up to pass through the stopping device, and FIG. 5 is a schematic view showing the stop from the first stopping plate when the transferring device drives the spacing piece to move down to pass through the stopping device. As shown in FIG. 4, taking a spacing piece 201a being bonded to a spacing piece 201b as an example, the suction arm 110 sucks the spacing pieces 201a and 201b to move to the stopping device 100. When the suction arm 110 reaches the stopping device 100, the spacing pieces 201a and 201b which move up are curved down from the positions thereof sucked by the suction arm 110. The spacing pieces 201a and 201b are deformed after receiving the stopping force from the first stopping plate 101, which generates forces F1 and F2 between the spacing pieces 201a and 201b to break the bonding force therebetween. As shown in FIG. 5, taking the spacing pieces 201a and 201b being bonded together as an example, the suction arm 110 sucks the spacing pieces 201a and 201b to move to the stopping device 100. When the suction arm 110 reaches the stopping device 100, the spacing pieces 201a and 201b which move down are curved up from the positions sucked by the suction arm 110.

Figure 6:
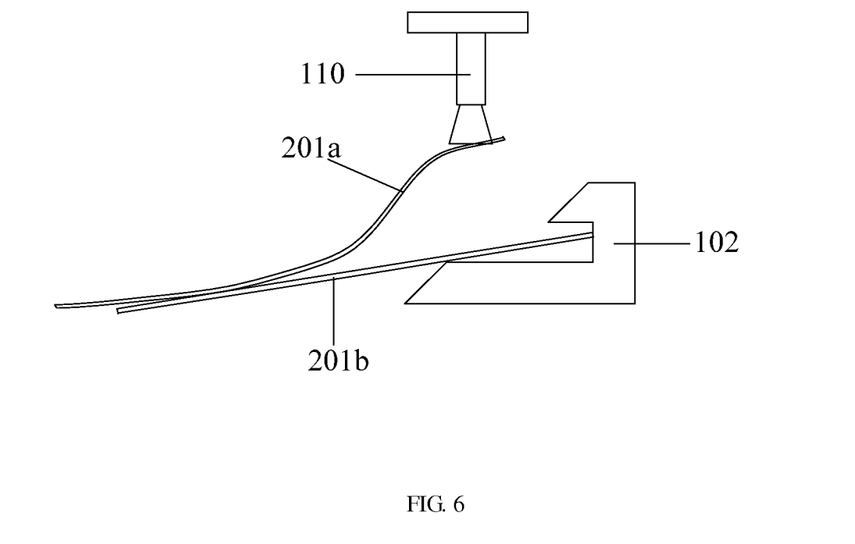
FIG. 6 is a schematic view showing the stop from a second stopping plate when the transferring device drives the spacing piece to pass through the stopping device.

Referring to FIG. 6, which is a schematic view showing the stop from a second stopping plate when the transferring device drives the spacing piece to pass through the stopping device. Taking the spacing pieces 201a and 201b being bonded together as an example, after passing through the first stopping plate 101, the spacing pieces 201a and 201b continuously to move forward as the suction arm 110 does. Since one end of the spacing piece 201b is separated from the spacing piece 201b due to the stop from the first stopping plate 101, and the spacing piece 201b is prevented from moving forward with the spacing piece 201a due to the stop of the second stopping plate 102, the spacing piece 201a is separated from the spacing piece 201b completely as the spacing pieces 201a and 201b move forward.

In the embodiment, with the first stooping plate 101 stopping the bonded spacing pieces 201a and 201b, the bonding force between the spacing pieces 201a and 201b is broken; with the stop from the second stopping plate 201, the bonding degree between the spacing pieces 201a and 201b is further broken, which separates the spacing piece 201b from the spacing piece 201a and further avoids fracture of the liquid crystal panel caused by the situation that a number of spacing pieces enter the packing box of the liquid crystal panel at the same time.

Figure 7:
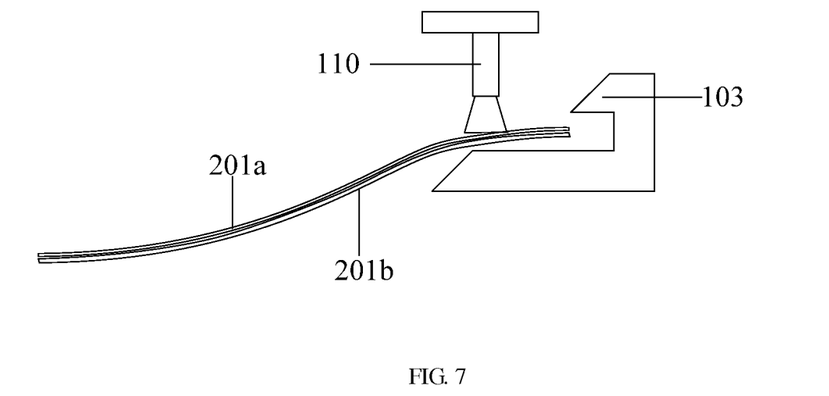
FIG. 7 is a schematic view showing the stop from a third stopping plate when the transferring device drives the spacing piece to pass through the stopping device.

Referring to FIG. 7, which is a schematic view showing the stop from a third stopping plate when the transferring device drives the spacing piece to pass through the stopping device. When the suction arm 110 sucks and drives the spacing pieces 201a and 201b to move forward, to two spacing pieces 201a and 201b bonded by a small bonding force, the spacing pieces 201a and 201b can be separated from each other by the stop from the first stopping plate 101 and the second stopping plate 102; however, to two spacing pieces bonded together by a large bonding force, the two spacing pieces are driven to continuously move forward by the suction arm 110. Take the spacing pieces 201a and 201b being bonded together as an example, as the suction arm 110 sucks and drives the spacing pieces 201a and 201b to move up and down, the bonding degree between the two spacing pieces are further broken due to the stop from the third stopping plate 103, which separates the spacing piece 201b from the spacing piece 201a.

In the embodiment, with the third stopping plate 103 configured for further stopping the bonded spacing pieces, the situation that a number of spacing pieces enter the packing box once can be effectively avoided.

Referring again to the FIGS. 1 and 2, a first chamfering portion 1011 is formed on one end of the first stopping plate 101 which is not connected to the second stopping plate 102. With the first chamfering portion 1011, the first stopping plate 101 is prevented from stopping the spacing piece 201 from moving forward when the spacing piece 201 passes through the first stopping plate 101, thereby avoiding the situation that the spacing piece 201 cannot move forwards. Additionally, the separated spacing piece 201 can slide into the packing box 200 along the first chamfering portion 1011 easily. Similarly, a second chamfering portion 1031 is formed on one end of the third stopping plate 103 which is not connected to the second stopping plate 102. Both the first chamfering portion 1011 and the second chamfering portion 1031 are respectively provided with an anti-static coating, which is preferably UPE. The anti-static coating can avoid static electricity generated by the friction between the spacing pieces when the spacing pieces pass through the first chamfering portion 1011 and the second chamfering portion 1031.

Figure 8:
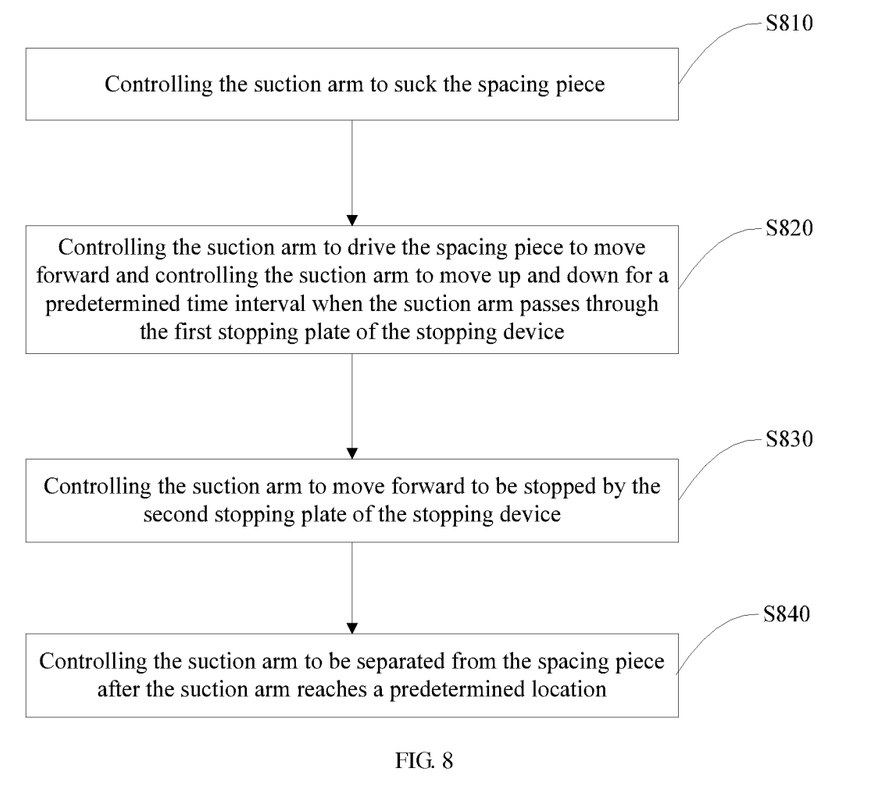
FIG. 8 is a flow chart of a transferring method in accordance with a first embodiment of the present disclosure.

Referring to FIG. 8, which is a flow chart of a transferring method in accordance with a first embodiment of the present disclosure. The transferring device used in the transferring method can be referred to that mentioned above and shown in FIGS. 3 to 6. The transferring method includes the following steps.

Step S810, controlling the suction arm 110 to suck the spacing piece.

Step S820, controlling the suction arm 110 to drive the spacing piece to move forward and controlling the suction arm 110 to move up and down for a predetermined time interval when the suction arm 110 passes through the first stopping plate 101 of the stopping device 100.

Step S830, controlling the suction arm 110 to move forward to be stopped by the second stopping plate 102 of the stopping device 100.

Step S840, controlling the suction arm 110 to be separated from the spacing piece after the suction arm 110 reaches a predetermined location.

Taking the spacing pieces 201a and 201b being bonded together as an example, the suction arm 110 moves forward after sucking the spacing pieces 201a, 201b. When the suction arm 110 reaches the stopping device, the top-to-bottom arranged spacing pieces 201a and 201b are stopped by the first stopping plate 101 of the stopping device 100. The spacing pieces 201a and 201b are deformed after receiving the force from the first stopping plate 101, which generates forces therebetween to break the bonding force between the spacing pieces 201a and 201b. In this way, after several times of up-to-down movements, the spacing piece 201b is separated from the spacing piece 201a.

As the suction arm 100 moves forward, the spacing pieces 201a and 201b move forward as well. When passing through the second stopping plate 102, the second stopping plate 102 stops one end of the spacing piece 201b which is separated from the spacing piece 201a to prevent the movement of the spacing piece 201b.

In the embodiment, by controlling the movement of the suction arm 110, the bonding force between the spacing pieces sucked by the suction arm 110 is broken by the first stopping plate 101 and the second stopping plate 102, thus, extra spacing pieces are separated from the suction arm 110 to avoid fracture of the liquid crystal panel caused by the situation that a number of spacing pieces enter the packing box of the liquid crystal panel at the same time.

Figure 9:
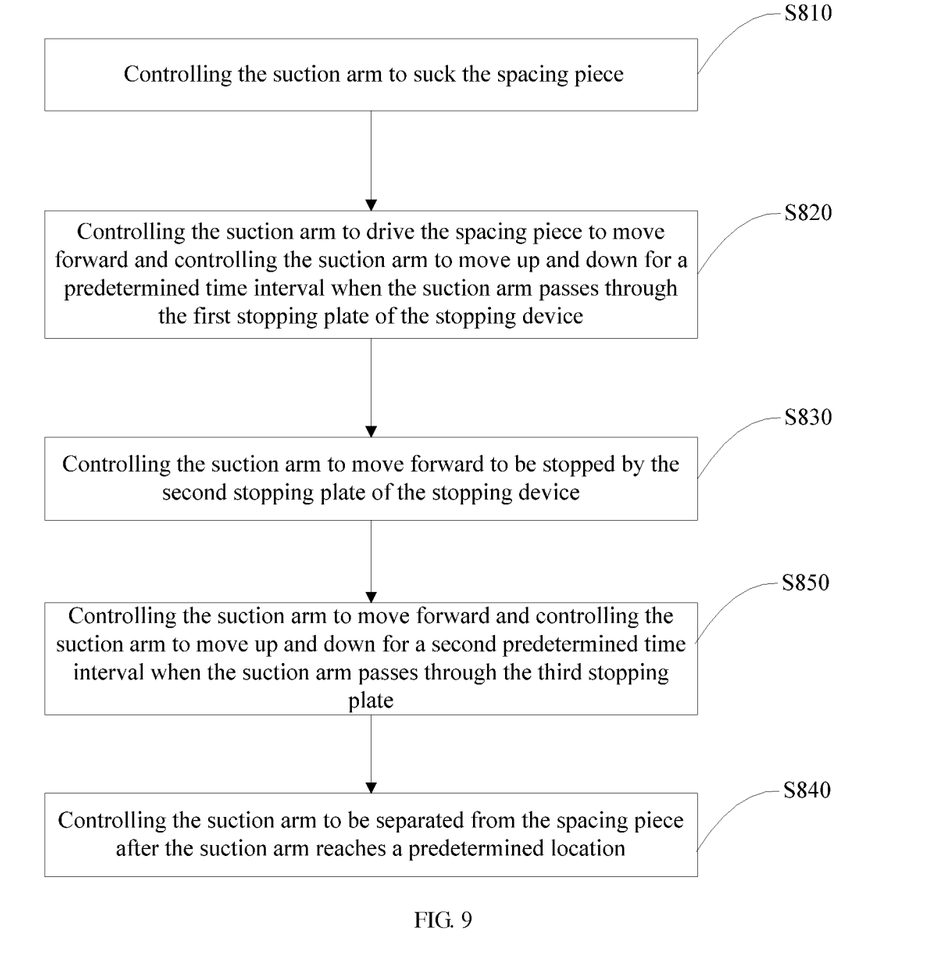
FIG. 9 is a flow chart of a transferring method in accordance with a second embodiment of the present disclosure.

Referring to FIG. 9, which is a flow chart of a transferring method in accordance with a second embodiment of the present disclosure. Based on the transferring method of the first embodiment, the transferring method of the second embodiment further includes the following step after the step of S830:

step S850, controlling the suction arm 110 to move forward and controlling the suction arm 110 to move up and down for a second predetermined time interval when the suction arm 110 passes through the third stopping plate 103.

When the suction arm 110 sucks and drives the spacing pieces 201a, 201b to move forward, to two spacing pieces 201a and 201b bonded by a small bonding force, the spacing pieces 201a and 201b are separated from each other due to the stop from the first stopping plate 101 and the second stopping plate 102; however, to two spacing pieces bonded together by a large bonding force, the two spacing pieces are driven to continuously move forward by the suction arm 110. Take the spacing pieces 201a and 201b being bonded together as an example, as the suction arm 110 sucks the spacing pieces 201a and 201b to move up and down, the bonding degree between the two spacing pieces are further broken due to the stop from the third stopping plate 103, which separates the spacing piece 201*b* from the spacing piece 201*a*.

Figure 10:
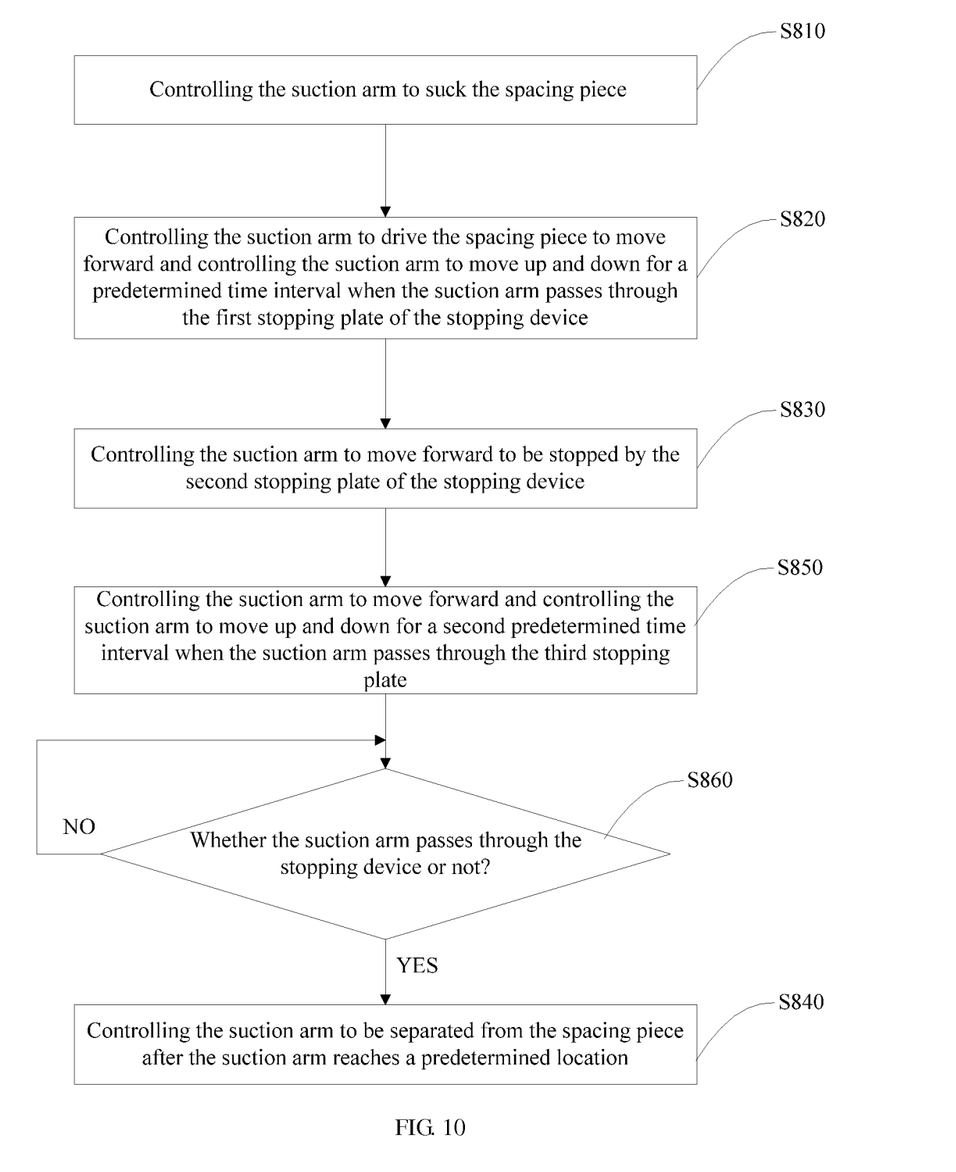
FIG. 10 is a flow chart of a transferring method in accordance with a third embodiment of the present disclosure.

Referring to FIG. 10, which is a flow chart of a transferring method in accordance with a third embodiment of the present disclosure. Based on the transferring method of the first embodiment or the second embodiment, the transferring method of the third embodiment further includes the following step after the step of S830:

step S860, detecting whether the suction arm 110 passes through the stopping device or not, if yes, going to step S840, otherwise returning to step S860.

After the spacing piece is taken out from the material-packing box, a sensor is used for detecting whether the spacing piece passes through the stopping device completely or not, which allows the spacing piece to be placed in the package precisely and reduces the influences to the liquid crystal panel from the spacing piece.

Even though information and the advantages of the present embodiments have been set forth in the foregoing description, together with details of the mechanisms and functions of the present embodiments, the disclosure is illustrative only; and that changes may be made in detail, especially in matters of shape, size, and arrangement of parts within the principles of the present embodiments to the full extend indicated by the broad general meaning of the terms in which the appended claims are expressed.

What is claimed is:

1. A transferring device, wherein the transferring device comprises a suction arm, a controlling device, and a stopping device; one end of the suction arm is connected to the controlling device, and the other end thereof is provided with a suction portion; the controlling device is used for controlling the suction arm to move to a predetermined location after being stopped by the stopping device; the stopping device comprises a first stopping plate and a second stopping plate connected to one end of the first stopping plate, and the first stopping plate and the second stopping plate form an angle which is less than or equal to 90 degrees; the controlling device is configured for controlling the suction arm to suck an uppermost spacing piece in a stack of deformable spacing pieces and to move forward until an end of the uppermost spacing piece is below the first stopping plate of the stopping device;

controlling the suction arm to move up and down for a first predetermined time interval when the end of the uppermost spacing piece is stopped by the first stopping plate of the stopping device, wherein the end of the uppermost spacing piece is driven to move up and down to deformedly pass through the first stopping plate of the stopping device;

controlling the suction arm to move forward until the uppermost spacing piece is separated from remaining spacing pieces of the stack due to a stop of the second stopping plate of the stopping device; and controlling the suction arm to be separated from the uppermost spacing piece when the suction arm reaches the predetermined location.

2. The transferring device as claimed in claim 1, wherein a third stopping plate extends from one end of the second stopping plate which is not connected to the first stopping plate, the third stopping plate is parallel to the first stopping plate, and the first stopping plate and the third stopping plate are arranged at the same side of the second stopping plate.

3. The transferring device as claimed in claim 2, wherein a first chamfering portion is formed on one end of the first stopping plate which is not connected to the second stopping plate, and a second chamfering portion is formed on one end of the third stopping plate which is not connected to the second stopping plate.

4. The transferring device as claimed in claim 2, wherein a second chamfering portion is formed on one end of the third stopping plate which is not connected to the second stopping plate.

5. The transferring device as claimed in claim 2, wherein the controlling device is used for controlling the suction arm to move forward until the end of the uppermost spacing piece is below the third stopping plate of the stopping device; and controlling the suction arm to move up and down for a second predetermined time interval when the end of the uppermost spacing piece is stopped by the third stopping plate of the stopping device, wherein the end of the uppermost spacing piece is driven to move up and down to deformedly pass through the third stopping plate of the stopping device.

6. The transferring device as claimed in claim 1, wherein a first chamfering portion is formed on one end of the first stopping plate which is not connected to the second stopping plate.

7. The transferring device as claimed in claim 1, wherein a through mounting hole is formed in the first stopping plate.

8. The transferring device as claimed in claim 1 further comprising a sensor, and a gap is defined between the sensor and the stopping device.

9. The transferring device as claimed in claim 8, wherein the gap is 6 mm wide.

10. The transferring device as claimed in claim 1, wherein the first stopping plate is 28 mm long, and the second stopping plate is 15 mm long.

11. A transferring method for transferring an uppermost spacing piece in a stack of deformable spacing pieces, comprising:

controlling a suction arm to suck the uppermost spacing piece and to move forward until an end of the uppermost spacing piece is below a first stopping plate of a stopping device;

controlling the suction arm to move up and down for a first predetermined time interval when the end of the uppermost spacing piece is stopped by the first stopping plate of the stopping device, wherein the end of the uppermost spacing piece is driven to move up and down to deformedly pass through the first stopping plate of the stopping device;

controlling the suction arm to move forward until the uppermost spacing piece is separated from remaining spacing pieces of the stack due to a stop of a second stopping plate of the stopping device; and controlling the suction arm to be separated from the uppermost spacing piece when the suction arm reaches a predetermined location.

12. The transferring method as claimed in claim 11 further comprising the following step after the step of controlling the suction arm to move forward to be stopped by a second stopping plate of the stopping device:

controlling the suction arm to move forward until the end of the uppermost spacing piece is below a third stopping plate of the stopping device; and controlling the suction arm to move up and down for a second predetermined time interval when the end of the uppermost spacing piece is stopped by the third stopping plate of the stopping device, wherein the end of the uppermost spacing piece is driven to move up and down to deformedly pass through the third stopping plate of the stopping device.

13. The transferring method as claimed in claim 11 further comprising the following step after the step of controlling the suction arm to move forward until the uppermost spacing piece is separated from remaining spacing pieces of the stack due to the stop of the second stopping plate of the stopping device:

detecting whether the uppermost spacing piece passes through the stopping device or not, if yes, performing the step of controlling the suction arm to be separated from the uppermost spacing piece when the suction arm reaches a predetermined location, otherwise returning to the step of detecting whether the uppermost spacing piece passes through the stopping device or not.

\* \* \* \* \*